(12) United States Patent
Wang et al.

(10) Patent No.: US 10,012,717 B2
(45) Date of Patent: Jul. 3, 2018

(54) SPATIALLY VARYING COIL COMPRESSION IN MAGNETIC RESONANCE IMAGE RECONSTRUCTION

(71) Applicant: Siemens Healthcare GmbH, Munich (DE)

(72) Inventors: Qiu Wang, Princeton, NJ (US); Marcel Dominik Nickel, Herzogenaurach (DE); Boris Mailhe, Plainsboro, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 500 days.

(21) Appl. No.: 14/685,635

(22) Filed: Apr. 14, 2015

(65) Prior Publication Data

US 2016/0306019 A1 Oct. 20, 2016

(51) Int. Cl.
*G01R 33/561* (2006.01)
*G01R 33/48* (2006.01)
*G01R 33/483* (2006.01)

(52) U.S. Cl.
CPC ...... *G01R 33/5611* (2013.01); *G01R 33/4822* (2013.01); *G01R 33/4826* (2013.01); *G01R 33/4835* (2013.01)

(58) Field of Classification Search
CPC ............ G01R 33/4822; G01R 33/4826; G01R 33/4835
See application file for complete search history.

(56) References Cited

U.S. PATENT DOCUMENTS

| 2005/0100202 | A1* | 5/2005 | Huang | G01R 33/5611 382/128 |
| 2012/0169338 | A1* | 7/2012 | King | G01R 33/5611 324/309 |
| 2013/0044960 | A1* | 2/2013 | Zhang | G01R 33/5611 382/232 |

\* cited by examiner

*Primary Examiner* — Jermele M Hollington
*Assistant Examiner* — Alvaro Fortich

(57) ABSTRACT

A method for performing a magnetic resonance image reconstruction with spatially varying coil compression includes using a non-Cartesian acquisition scheme to acquire a multi-coil k-space dataset fully sampled along a fully sampled direction and decoupling the multi-coil k-space dataset along the fully sampled direction to yield a plurality of uncompressed coil data matrices. The plurality of uncompressed coil data matrices are compressed to yield a plurality of virtual coil data matrices which are aligned along the fully sampled direction to yield a plurality of aligned virtual coil data matrices. The aligned virtual coil data matrices are coupled along the fully sampled direction to yield a compressed multi-coil k-space dataset. Intensity values in the plurality of aligned virtual coil data matrices are normalized based on the plurality of uncompressed coil data matrices and an image is reconstructed using the compressed multi-coil k-space dataset.

8 Claims, 6 Drawing Sheets

SPATIALLY VARYING COIL COMPRESSION IN MAGNETIC RESONANCE IMAGE RECONSTRUCTION

TECHNOLOGY FIELD

The present invention relates generally to methods, systems, and apparatuses for performing Magnetic Resonance Imaging (MRI) reconstruction using spatially varying coil compression techniques. The disclosed techniques may be applied to both Cartesian and non-Cartesian sampling schemes.

BACKGROUND

Parallel Magnetic Resonance Imaging (MRI) works by acquiring a reduced amount of k-space data with an array of receiver coils. Increasing the number of receiver coils increases signal-to-noise ratios therefore improving reconstructed image quality. However, processing of data from a large set of independent receiver coils leads to increased memory and computational load in reconstruction. These increases can be especially problematic for 3D acquisitions and in iterative reconstructions. Coil compression techniques are effective in mitigating this problem by compressing redundant data from many physical coils into fewer virtual coils.

Conventional coil compression techniques take the k-space dataset (with dimensions of 2D, 2D+Time, 3D or 3D+Time) and compress the number of coils globally. Initially, k-space data is processed into a two-dimensional matrix where one dimension is all the data from one coil and the other dimension is all coils. Then, a singular variable decomposition (SVD) is used to reduce the dimension along the coil dimension (the second dimension), thus reducing the number of total coils. This results in a new k-space dataset, with a smaller number of virtual coils, which is the starting point for the reconstruction.

Recently, coil compression techniques have been introduced to exploit the spatially varying coil sensitivities in non-subsampled dimensions for better compression and computation reduction. Although these techniques offer promising results, they are designed for Cartesian acquisition schemes. Thus, they are not readily extended to non-Cartesian acquisition schemes employed in many parallel imaging applications. In addition, the existing methods only consider spatial variation along the readout dimension in MR acquisition, and ignore the possibility to explore spatial variation along the other spatial dimensions. Accordingly, it is desired to create a spatially varying coil compression technique that can be applied in any clinical scenario.

SUMMARY

Embodiments of the present invention address and overcome one or more of the above shortcomings and drawbacks, by providing methods, systems, and apparatuses related to a spatially varying coil compression for Magnetic Resonance Imaging (MRI) reconstruction applications. The proposed schemes provide several benefits over conventional reconstruction applications, including the ability to compress datasets acquired with non-Cartesian sampling schemes, and being able to consider spatial variation along any non-subsampled dimensions during the compression.

A method for performing in magnetic resonance image reconstruction with spatially varying coil compression includes using a non-Cartesian acquisition scheme to acquire a multi-coil k-space dataset fully sampled along a fully sampled direction (e.g., a phase encoding direction, or a slice-selection direction). The non-Cartesian acquisition scheme may apply, for example, a stack-of-spirals k-space trajectory or a stack-of-stars k-space trajectory. The multi-coil k-space dataset is decoupled along the fully sampled direction to yield uncompressed coil data matrices. The uncompressed coil data matrices are compressed to yield virtual coil data matrices which are aligned along the fully sampled direction to yield aligned virtual coil data matrices. In some embodiments, these virtual coil data matrices are sized according to a user-selected per-coil energy distribution. The aligned virtual coil data matrices are coupled along the fully sampled direction to yield a compressed multi-coil k-space dataset. Intensity values in the aligned virtual coil data matrices are normalized based on the uncompressed coil data matrices and an image is reconstructed using the compressed multi-coil k-space dataset.

Various techniques may be used for normalizing intensity values in the aligned virtual coil data matrices based on the uncompressed coil data matrices in the aforementioned method. For example, in one embodiment, a sum of squares difference is calculated for each aligned virtual coil data matrix with respect to a corresponding uncompressed coil data matrix. Then, each respective aligned virtual coil data matrix is normalized according to its respective sum of squares difference. In another embodiment, a normalized cross-correlation is calculated for each aligned virtual coil data matrix with respect to a corresponding uncompressed coil data matrix. Then, each respective aligned virtual coil data matrix is normalized according to its respective normalized cross-correlation.

According to other embodiments, a method magnetic resonance image reconstruction with spatially varying coil compression may be performed without coupling of the aligned virtual coil data matrices. More specifically, an acquisition scheme may be used to acquire a multi-coil k-space dataset fully sampled along a fully sampled direction (e.g., a phase encoding direction, or a slice-selection direction). The multi-coil k-space dataset may then be decoupled along the fully sampled direction to yield uncompressed coil data matrices which, in turn, may be compressed to virtual coil data matrices. In some embodiments, these virtual coil data matrices are sized according to a user-selected per-coil energy distribution. The virtual coil data matrices are aligned along the fully sampled direction and intensity values in the aligned virtual coil data matrices are normalized based on the uncompressed coil data matrices. The normalization may be based on, for example, sum of squares difference for each aligned virtual coil data matrix or calculating a normalized cross-correlation for each aligned virtual coil data matrix. Following normalization, one or more images may be reconstructed using the aligned virtual coil data matrices.

According to other embodiments, a system for reconstructing magnetic resonance imaging data comprises an imaging device and a central control computer unit. The imaging device comprises coils configured to use in a non-Cartesian stacked acquisition scheme to acquire a multi-coil k-space dataset fully sampled along a fully sampled direction. In some embodiments, the non-Cartesian stacked acquisition scheme acquires a subsampled k-space dataset which are combined to yield the multi-coil k-space dataset fully sampled along a partition encoding direction.

The central control computer unit in the aforementioned system is configured to decouple the multi-coil k-space dataset along the fully sampled direction to yield uncompressed coil data matrices, compress the uncompressed coil data matrices to yield virtual coil data matrices, and align the virtual coil data matrices along the fully sampled direction to yield aligned virtual coil data matrices. The central control computer unit is further configured to couple the aligned virtual coil data matrices along the fully sampled direction to yield a compressed multi-coil k-space dataset, normalize intensity values in the aligned virtual coil data matrices based on the uncompressed coil data matrices, and reconstruct an image using the compressed multi-coil k-space dataset.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to spatially varying coil compression in Magnetic Resonance Imaging (MRI) reconstruction. The spatially-varying coil compression technique described herein may be applied in any possible fully sampled dimension (e.g., readout, phase encoding, or partition encoding), for both Cartesian sampling and non-Cartesian stacked acquisition schemes (e.g., stack-of-stars or stack-of-spirals). This method performs coil compression separately for each spatial location along the fully sampled directions, followed by an additional alignment process that guarantees the smoothness of the virtual coil sensitivities. The described techniques may be implemented without changes to physical coil design or any other imaging hardware component.

The spatially-varying coil compression techniques described herein in various embodiments offer benefits that are absent in similar conventional compression techniques. For example, the disclosed technology is more broadly applicable across different datasets. They may be applied to non-Cartesian stacked acquisitions, as well as k-space datasets that allow coil compression in multiple dimensions (e.g. when the readout or the partition directions are both fully sampled). Additionally, some embodiments, include intensity compensation to correct any signal variation after the compression. Moreover, for computing the compression matrix (a critical step during coil compression), the described techniques do not require auto-calibration signal (ACS) data for certain acquisition methods for dynamic data.

Figure 1:
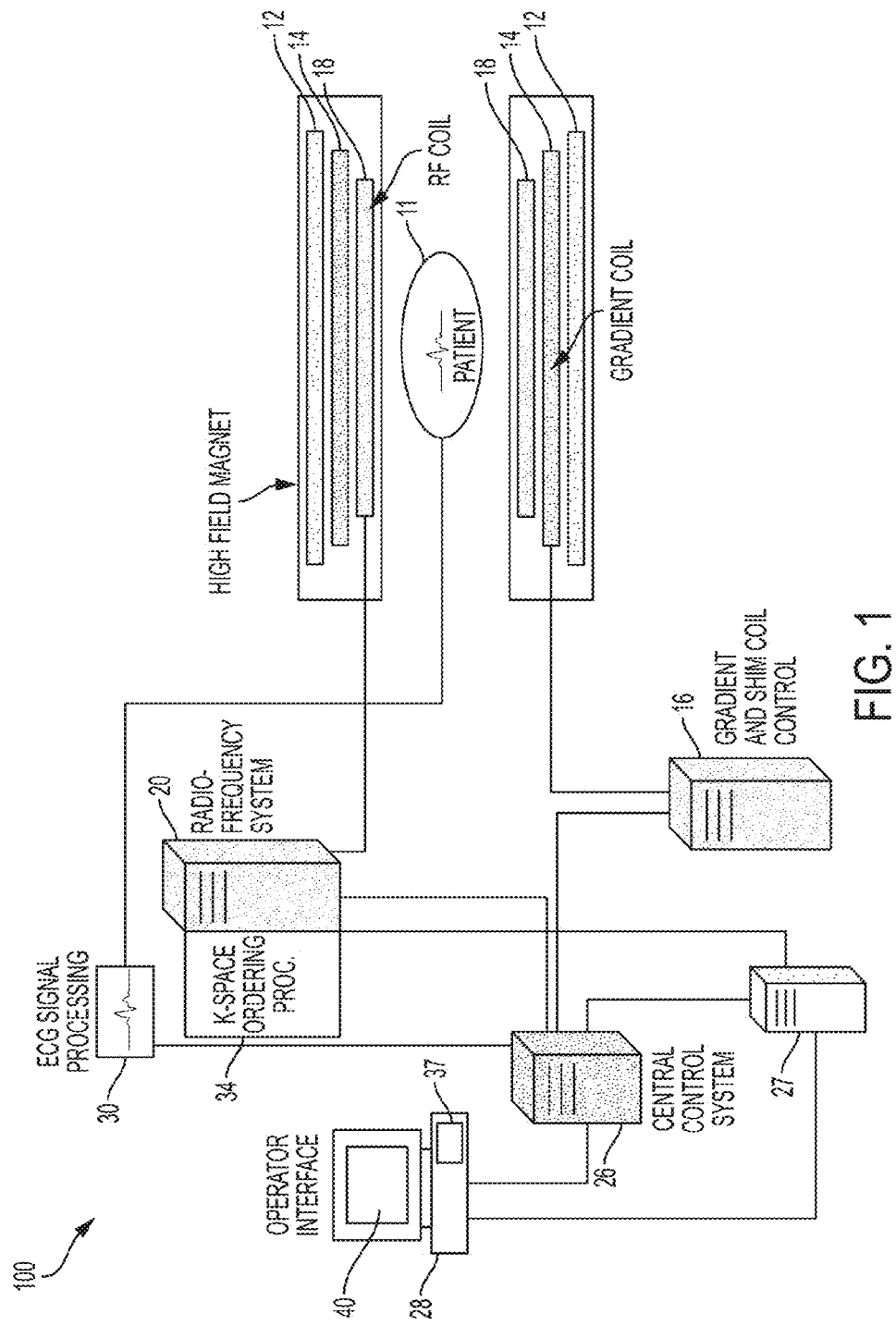
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing MRI data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of a magnetic resonance dataset representing a magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components which is substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction. For example, in conventional systems, an optimization algorithm is applied to iteratively solve a cost function which results in the reconstructed image.

According to various embodiments described herein, the system 100 illustrated in FIG. 1 is applied to perform spatially-varying coil compression in any possible fully sampled dimension, for both Cartesian sampling and non-Cartesian stacked samplings (e.g., stack-of-stars or stack-of-spirals). Briefly, the k-space data from the physical coils are decoupled along a fully sampled direction to produce a plurality of slices. Each slice is independently compressed to yield a plurality of virtual coils. These virtual coils are then aligned and coupled back along the fully sampled direction. The aligned coils may then be used to create a compressed k-space dataset which, in turn, may be used to reconstruct the image.

Figure 2:
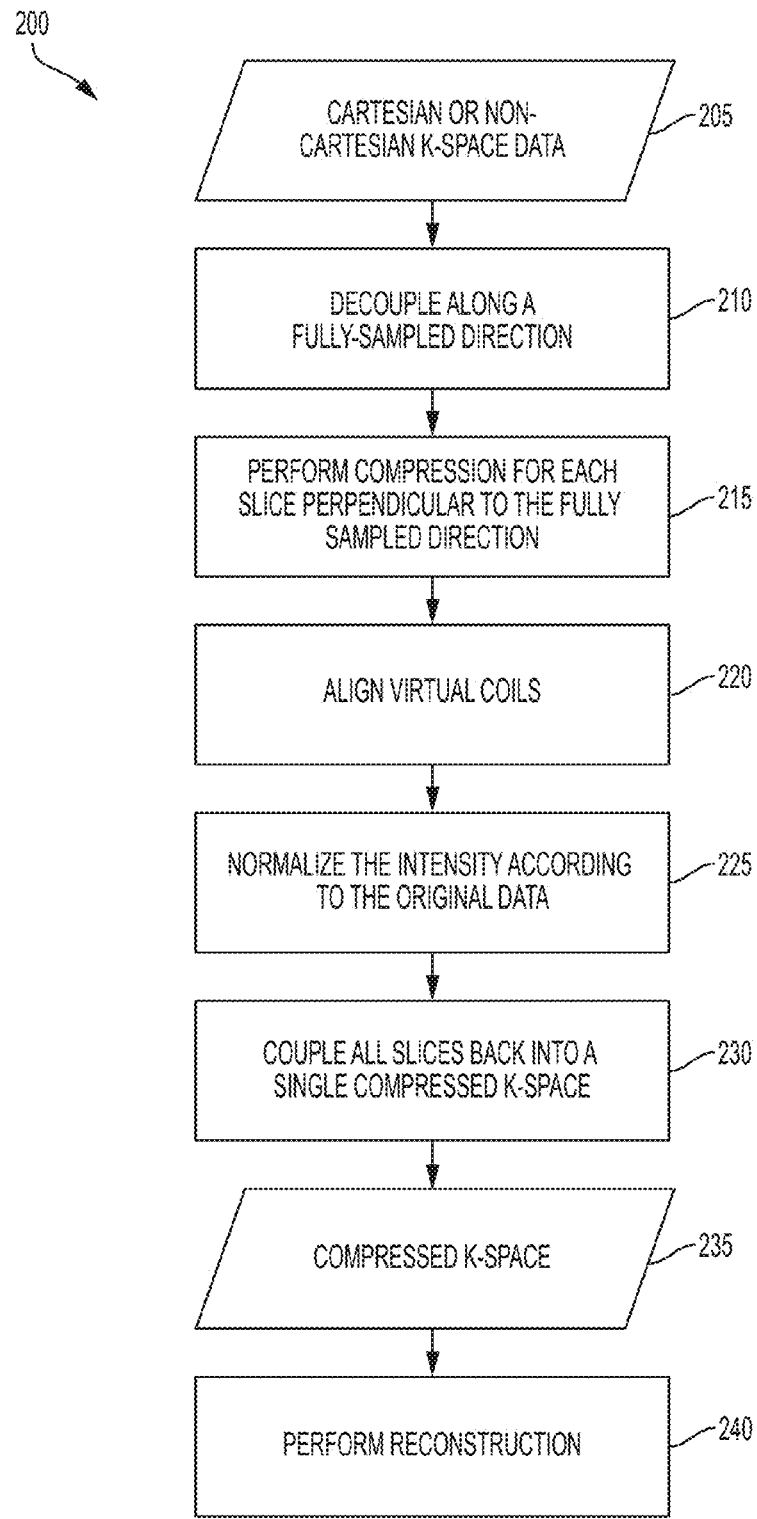
FIG. 2 provides an illustration of a spatially varying coil compression method, according to some embodiments.

FIG. 2 provides an illustration of a spatially varying coil compression method 200, according to some embodiments. This method 200 is performed using Cartesian or Non-Cartesian k-space data 205 acquired with a parallel imaging technique, for example, using the system 100 illustrated in FIG. 1. Non-Cartesian MRI refers to any acquisition scheme where the k-space trajectory does not fall on a Cartesian grid. For example, a radial, echo planar imaging-based, or spiral trajectories all provide data that may be characterized as non-Cartesian. Non-Cartesian MRI is generally faster and more motion robust than Cartesian MRI.

Depending on how the k-space data 205 was acquired, it will be fully sampled along one direction. For example, in Cartesian acquisition schemes, the readout direction is always fully sampled. In Non-Cartesian acquisition schemes where there is no single readout direction, other directions are fully sampled. Often this direction is determined by an encoding direction. For example, depending on how the acquisition is configured, the partition-encoding direction or the phase-encoding direction may be fully sampled. Often the fully sampled direction can be readily determined based on the exact acquisition scheme employed. For example, for Golden-Angle Radial Sparse Parallel (GRASP) MRI acquisitions, the stack-of-stars sequence results in full sampling in the partition direction. If the acquired data is fully sampled in two or more directions (e.g., the readout and partition directions), one direction may be selected, for example, based on user-input at the time of scan or based on a default value associated with the acquisition scheme.

Continuing with reference to FIG. 2, a step 210, the acquired k-space data is decoupled by inverse Fourier transforming along the fully sampled direction. This decoupling produces a plurality of slices from the original k-space dataset. Decoupling allows the 3D reconstruction problem to be simplified in a plurality of 2D problems. This provides benefits from the coil compression point of view because each coil is more sensitive to things happening in its respective neighborhood of coils. By decoupling the data, compression may be performed slice-by-slice. In turn, this allows the coils to be more compressible because the effects from data that is acquired with a coil that is far away from the patient are minimized.

Next, step 215, compression of each slice is performed separately along the fully sampled direction. Let the fully sample direction be the x direction, and y-z directions represent the plane of one slice. More specifically, for each slice, compression is applied to a data matrix where each row represents the k-space data in the y and z planes for a particular coil. This yields an updated matrix, referred to herein as the "compressed matrix" for that slice. Any compression technique generally known in the art and applicable to the type of data may be applied at step 215. For example, for non-Cartesian acquisitions, Singular Variable Decomposition (SVD) Compression may be applied. For Cartesian acquisitions, SVD Compression or techniques such as Geometric-decomposition Coil Compression (GCC) may be used. It should be noted that, in contrast to conventional systems, the compression performed at step 215 does not necessarily require ACS data for certain acquisition methods for dynamic data (e.g., in non-Cartesian acquisitions where the k-space center is densely sampled).

Figure 4:
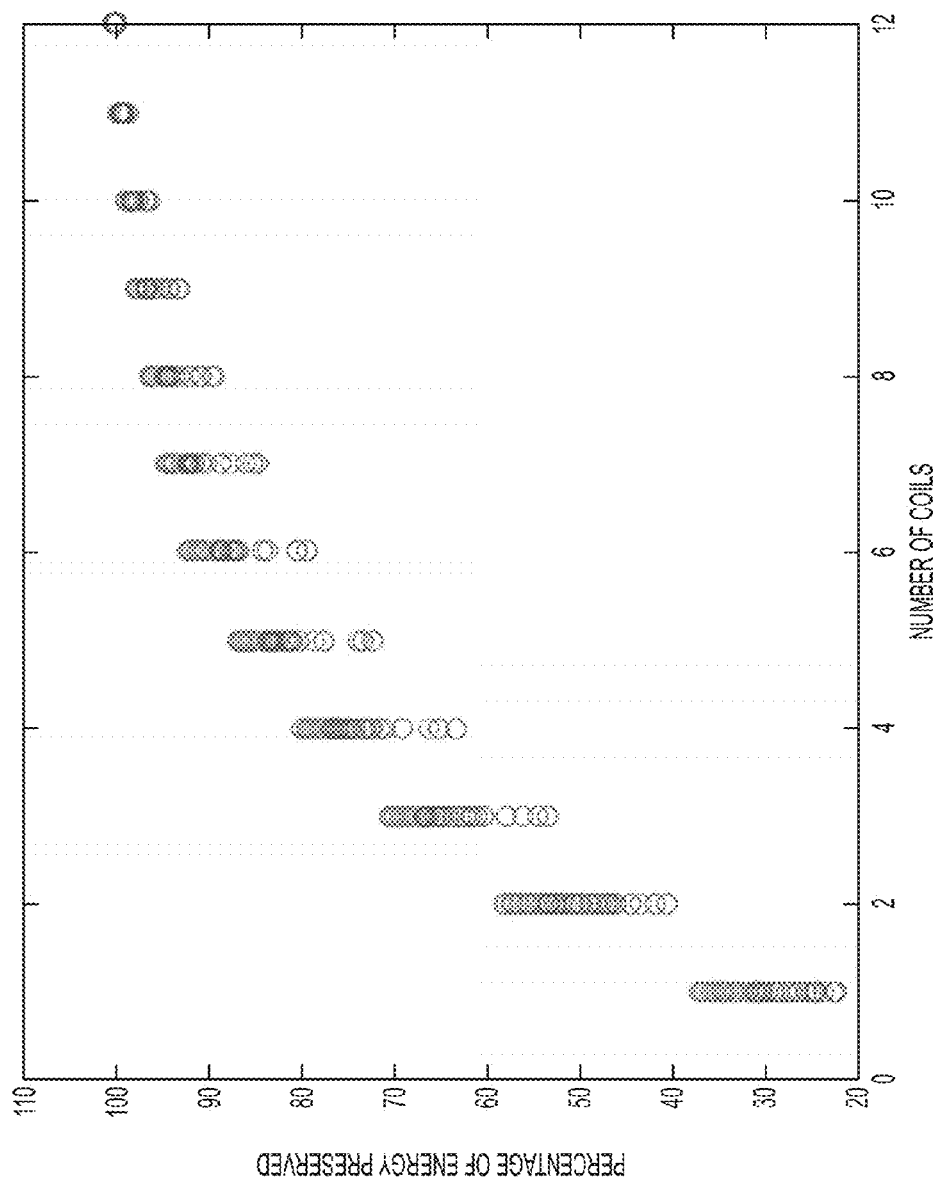
FIG. 4 provides a plot of the number of coils versus the percentage of energy preserved following compression.

The number of virtual coils may be empirically selected by the user prior to execution of the process. For example, FIG. 4 provides a plot of the number of coils versus the percentage of energy preserved following compression, according to some embodiments. In this example, there are 12 physical coils and 80 slices. Each plotted circle represents one slice. As shown in the plot, energy may be 90% preserved for all slices by compressing to no less than 8 virtual coils. However, if greater energy losses are acceptable, even fewer virtual coils may be used. The number of desired virtual coils may be directly applied in the compression algorithm. For example, where SVD is used, the number of coils may be used for thresholding the singular values.

Returning to FIG. 2, at step 220, the compression matrices are aligned to reduce any non-smooth coil sensitivity introduced along the fully sampled direction due to the compression process performed at step 215. To guarantee smoothness of these sensitivities, the virtual coils are aligned at step 220. In some embodiments each virtual coil is defined as an orthonomal vector in subspace of its respective slice, the virtual coils may be aligned across the corresponding compression matrices by aligning vectors between slices that are closely positioned with one another. For example, in one embodiment, the Euclidean distance between each virtual coil is determined and the vectors with the smallest difference in two slices are aligned. This process may be repeated for all the virtual coils included in the compression matrices. In some embodiments, the alignment is performed by iteratively solving an optimization problem which minimizes the differences between adjacent slices.

Next step 225, intensity normalization is to correct for signal variation that occurs during compression. After compression, in the plane in which the compression is performed, there could be variations compared to original data. To address this, the signal is normalized to the original data in the plane in which the compression is performed. Since the number of physical coils is different than the number of virtual coils, the two datasets cannot be directly compared. To mitigate these differences, one or more normalization techniques known in the art may be applied. For example, in one embodiment, a sum of square comparison of the two datasets is used for normalization. In other embodiments, a normalized cross-correlation is applied.

Following the alignment of the virtual coils and intensity normalization, at step 230 each slice is coupled back into a single compressed k-space 235 using Fourier transformation. Finally, at step 240, single compressed k-space 235 is reconstructed into an image volume using any reconstruction technique generally known in the art. For example, in some embodiments, Compressed Sensing techniques such as Fast Iterative Shrinkage-Thresholding Algorithm (FISTA) are used.

Figure 3:
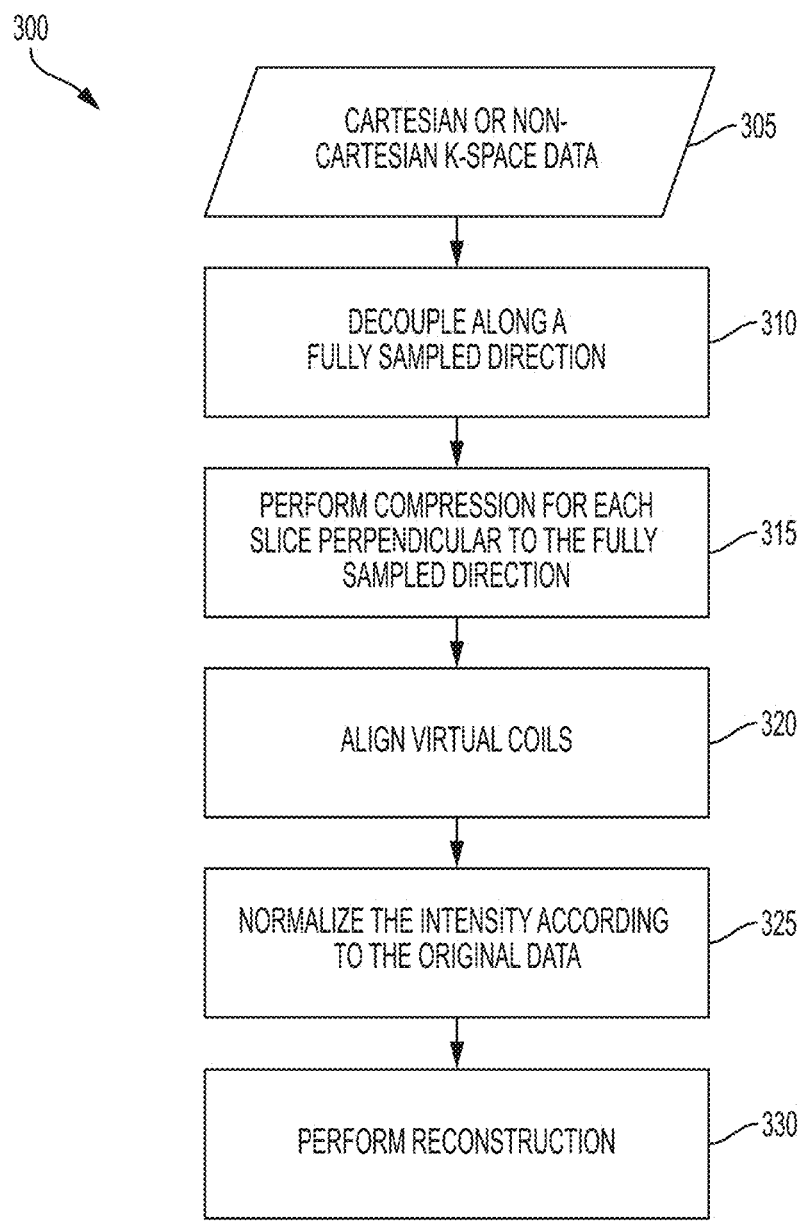
FIG. 3 provides an illustration of an alternate spatially varying coil compression method, according to some embodiments.

FIG. 3 provides an illustration of alternate spatially varying coil compression method 300, according to some embodiments. The method 300 illustrated in FIG. 3 is similar to that presented in FIG. 2. Thus, Cartesian or Non-Cartesian multi-coil k-space data 305 is decoupled along a fully-sampled direction at step 310 to yield a plurality of slices. Next, at step 315, compression is performed on these slices to yield a plurality of slices. These slices are then aligned at step 320. At step 325, intensity normalization is used prior to reconstruction to correct for signal variation that occurs during compression. As described in the FIG. 2, this normalization may be based, for example, on a sum of square comparison or a normalized cross-correlation of the two datasets.

A difference between the method 200 illustrated in FIG. 2 and the method 300 of FIG. 3 is that the latter does not couple data prior to reconstruction. Thus, at step 330, reconstruction is performed directly on the slice data. Reconstruction can be performed in either a decoupled or coupled manner. That is, each decoupled slice may be independently reconstructed or, after all the decoupled slices have been compressed, they may be jointly reconstructed into a volume. In order to construct the volume, reconstruction cannot be performed until all the data has been processed and coupled. Depending on the clinical application, the time required to wait for such process may be unacceptable. Thus, by forgoing coupling, image slices can be reconstructed directly for quicker presentation.

Figure 5:
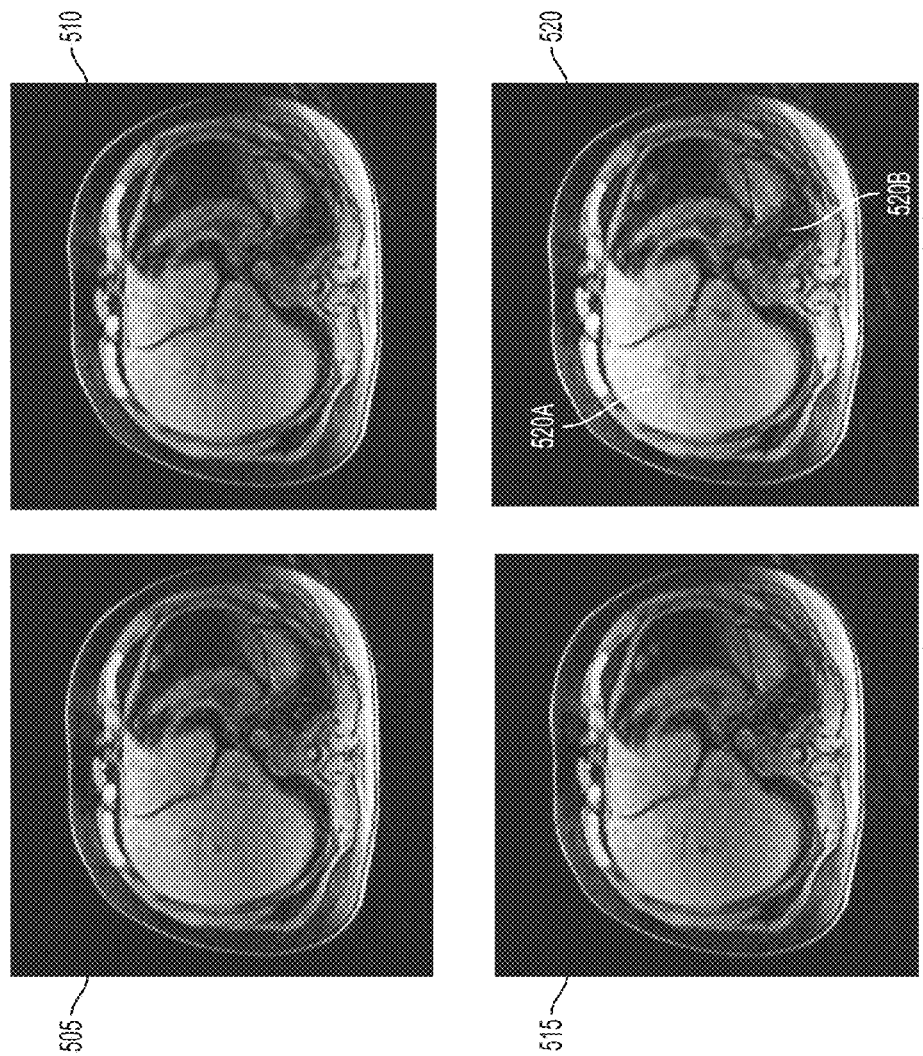
FIG. 5 provides a set of reconstructed images from coil compressed k-space data, which illustrate a spatially varying coil compression process.

FIG. 5 provides a set of images 505, 510, 515, 520 which illustrate a spatially varying coil compression process. In this example, data was acquired using 12 channels. Image 505 shows the original data with all 12 coils, while image 510 was reconstructed using an image dataset compressed to 9 virtual coils. FIG. 4 provides a plot of the number of coils versus the percentage of energy preserved following compression. As shown in this plot, reducing the number of coils to 9 using spatially varying coil compression allows nearly all the energy to be maintained. Thus, images 505 and 510 appear almost identical. Image 515 shows the same data set compressed to 6 virtual coils. Image 520 shows the same data set compressed to 3 virtual coils. Although the reconstructed image 505 still provides a quality representation of the original dataset, some blurring and other artifacts (e.g., regions 520A and 520B) are present in the image 505.

Figure 6:
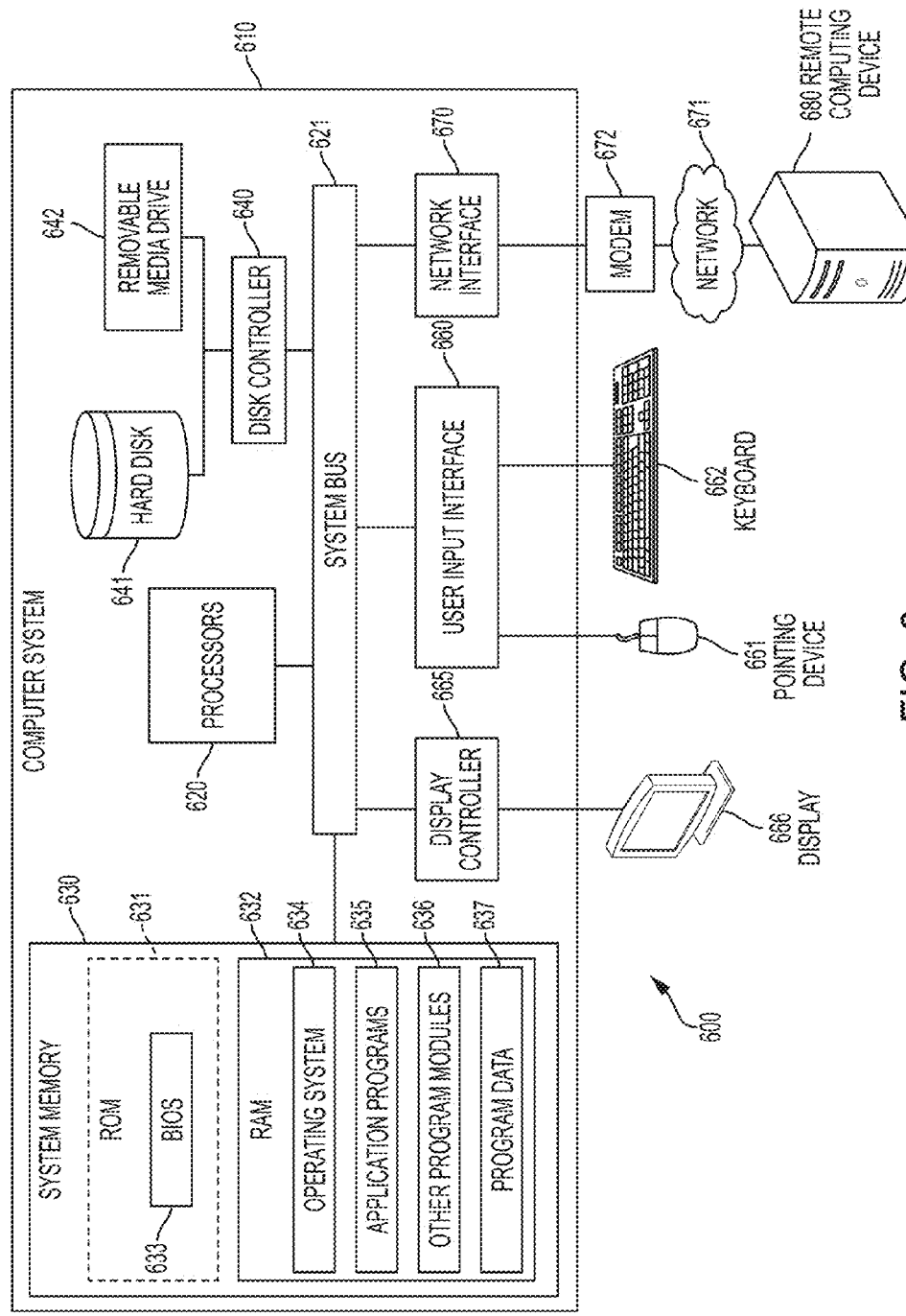
FIG. 6 illustrates an exemplary computing environment within which embodiments of the invention may be implemented.

FIG. 6 illustrates an exemplary computing environment 600 within which embodiments of the invention may be implemented. For example, this computing environment 600 may be used to implement the methods 300, 200 of image reconstruction described in FIGS. 2 and 3. In some embodiments, the computing environment 600 may be used to implement one or more of the components illustrated in the system 100 of FIG. 1. The computing environment 600 may include computer system 610, which is one example of a computing system upon which embodiments of the invention may be implemented. Computers and computing environments, such as computer system 610 and computing environment 600, are known to those of skill in the art and thus are described briefly here.

As shown in FIG. 6, the computer system 610 may include a communication mechanism such as a bus 621 or other communication mechanism for communicating information within the computer system 610. The computer system 610 further includes one or more processors 620 coupled with the bus 621 for processing the information. The processors 620 may include one or more central processing units (CPUs), graphical processing units (GPUs), or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system (BIOS) 633 containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computer 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

What is claimed is:

1. A method for performing a magnetic resonance image reconstruction with spatially varying coil compression, the method comprising:
    using a non-Cartesian acquisition scheme to acquire a multi-coil k-space dataset fully sampled along a fully sampled direction;
    decoupling the multi-coil k-space dataset along the fully sampled direction to yield a plurality of uncompressed coil data matrices;
    compressing the plurality of uncompressed coil data matrices to yield a plurality of virtual coil data matrices;
    aligning the plurality of virtual coil data matrices along the fully sampled direction to yield a plurality of aligned virtual coil data matrices;
    coupling the plurality of aligned virtual coil data matrices along the fully sampled direction to yield a compressed multi-coil k-space dataset;
    normalizing intensity values in the plurality of aligned virtual coil data matrices based on the plurality of uncompressed coil data matrices; and
    reconstructing an image using the compressed multi-coil k-space dataset.

2. The method of claim 1, wherein the fully sampled direction is a phase encoding direction.

3. The method of claim 1, wherein the fully sampled direction is a slice-selection direction.

4. The method of claim 3, wherein the non-Cartesian acquisition scheme applies a stack-of-spirals k-space trajectory.

5. The method of claim 3, wherein the non-Cartesian acquisition scheme applies a stack-of-stars k-space trajectory.

6. The method of claim 1, wherein each of the plurality of virtual coil data matrices is sized according to a user-selected per-coil energy distribution.

7. The method of claim 1, wherein normalizing intensity values in the plurality of aligned virtual coil data matrices based on the plurality of uncompressed coil data matrices comprises:
    calculating a sum of squares difference for each aligned virtual coil data matrix with respect to a corresponding uncompressed coil data matrix,
    wherein each respective aligned virtual coil data matrix in the plurality of aligned virtual coil data matrices is normalized according to its respective sum of squares difference.

8. The method of claim 1, wherein normalizing intensity values in the plurality of aligned virtual coil data matrices based on the plurality of uncompressed coil data matrices comprises:
    calculating a normalized cross-correlation for each aligned virtual coil data matrix with respect to a corresponding uncompressed coil data matrix,
    wherein each respective aligned virtual coil data matrix in the plurality of aligned virtual coil data matrices is normalized according to its respective normalized cross-correlation.

* * * * *